US007127809B2

(12) United States Patent
Berry et al.

(10) Patent No.: US 7,127,809 B2
(45) Date of Patent: Oct. 31, 2006

(54) METHOD OF FORMING ONE OR MORE BASE STRUCTURES ON AN LTCC COFIRED MODULE

(75) Inventors: Cynthia W. Berry, Pasadena, MD (US); Alex E. Bailey, Hampstead, MD (US); Robert Fisher, Westminster, MD (US); Tapan K. Gupta, Ellicott City, MD (US); Daniel Brosey, Finksburg, MD (US); Steve M. Smalley, Columbia, MD (US); William A. Thomas, Randallstown, MD (US)

(73) Assignee: Northrop Grumman Corporation, Los Angeles, CA (US)

( * ) Notice: Subject to any disclaimer, the term of this patent is extended or adjusted under 35 U.S.C. 154(b) by 292 days.

(21) Appl. No.: 10/802,746

(22) Filed: Mar. 18, 2004

(65) Prior Publication Data
US 2005/0205195 A1   Sep. 22, 2005

(51) Int. Cl.
*H05K 3/30* (2006.01)

(52) U.S. Cl. .............................. 29/832; 29/840; 29/851; 156/89.12; 174/259; 361/830

(58) Field of Classification Search ................. 29/825, 29/832, 846, 851, 852, 830, 840; 174/255–260; 156/89.11–89.21, 89.28; 257/702–706; 361/728, 361/738, 748, 829, 830; 427/123, 125
See application file for complete search history.

(56) References Cited

U.S. PATENT DOCUMENTS

| 5,006,182 A | * | 4/1991 | Gantzhorn et al. ...... 156/89.16 |
| 5,847,326 A | * | 12/1998 | Kawakami et al. ......... 174/256 |
| 6,041,496 A | * | 3/2000 | Haq et al. ..................... 29/852 |
| 6,271,579 B1 | * | 8/2001 | Going et al. ................. 257/664 |
| 6,384,473 B1 | * | 5/2002 | Peterson et al. ............ 257/680 |

* cited by examiner

*Primary Examiner*—Minh Trinh
*Assistant Examiner*—Donghai D. Nguyen
(74) *Attorney, Agent, or Firm*—Birch, Stewart Kolasch & Birch, LLP

(57) ABSTRACT

An LTCC module includes a base on one or more surfaces for receiving one or more external components to be attached to the module. A base is formed of a plurality of layers of metallization in a predetermined pattern. The layers include an adhesion layer on the LTCC module surface, with one or more intermediate layers, followed by a top layer. The module is fired with each application of the layers at a reduced temperature lower than the normal cofiring temperature of the LTCC module, but of sufficient value to partially sinter the layers. After the last applied top layer, the module is fired once at an elevated temperature to fully sinter the layers.

10 Claims, 3 Drawing Sheets

METHOD OF FORMING ONE OR MORE BASE STRUCTURES ON AN LTCC COFIRED MODULE

BACKGROUND OF THE INVENTION

1. Field of the Invention

The invention in general relates to the field of LTCC (low temperature cofired ceramic) circuitry.

2. Description of Related Art

An LTCC circuit is comprised of a plurality of ceramic layers with passive and/or active components and stacked together to form a module, with each ceramic layer containing thick film printed circuitry metallization, generally gold or silver. The ceramic layers include conductive vias for making electrical contact between layers and the stack of ceramic layers is cofired at a temperature high enough to sinter the layers, yet low enough so as prevent flowing or melting of the metallization. The result of the firing is to form a rigid monolithic structure.

LTCC circuits have high packing density, can be customized to meet desired applications, are cost effective, reliable and can be controlled with respect to dielectric values. The LTCC allows for integration of digital and RF, stripline and microstrip circuits in a single light weight 3-D package. Such LTCC circuits are used for high frequency applications in both military as well as commercial devices.

Often, after the LTCC module is cofired, it is desirable to add additional layers of metallization, in a certain pattern, to build up a base, on one or more surfaces, to which some component is to be attached. Such component may be a frame structure, a heat sink or an electrical connector block, by way of example.

Typically, the base to which the component is attached is made up of a plurality of metal layers to achieve a desired thickness. Each layer of the base is screened on, in the predetermined pattern and then fired at the cofiring temperature of around 850° C. This procedure of repeated firings of the LTCC module, however, at the elevated temperature, has an adverse affect on buried components such as resistors, capacitors and inductors which may change with these repeated firings. For example buried resistors may actually change their initial resistance value by more than 50% with repeated firings. Further, repeated high temperature firings may affect solderable layers and change their bondability.

In addition, some ceramic materials which comprise the ceramic layers will also change with repeated high temperature firings. As the ceramic material is heated to a temperature above its crystallization temperature, additional crystallization occurs. This crystallization can modify the dielectric constant and density of the ceramic.

It is an object of the present invention to minimize or eliminate the above described changes without degrading the performance of the metallization forming the base.

SUMMARY OF THE INVENTION

A method is described for forming at least one multilayered base having a predetermined pattern on at least one surface of a multi-surfaced LTCC module which has a stack of ceramic layers fired at a first, cofired temperature. The method includes applying a plurality of metal layers in one or more predetermined patterns on one or more of the LTCC module surfaces. The module is fired, as predetermined layers are applied, at a second temperature lower than the first, cofired temperature, but of a value to partially sinter the applied metal layers. The module is fired, after a last of the metal layers is applied, only once at an elevated temperature greater than the second temperature, to fully sinter the metal layers. In one embodiment the module is fired after the application of each metal layer and in another embodiment one or more metal layers may be applied, allowed to dry, and receive a next metal layer, prior to firing.

Further scope of applicability of the present invention will become apparent from the detailed description provided hereinafter. It should be understood, however, that the detailed description and specific example, while disclosing the preferred embodiment of the invention, is provided by way of illustration only, since various changes and modifications within the spirit and scope of the invention will become apparent to those skilled in the art, from the detailed description.

BRIEF DESCRIPTION OF THE DRAWINGS

The present invention will become more fully understood from the detailed description provided hereinafter and the accompanying drawings, which are not necessarily to scale, and are given by way of illustration only, and wherein.

DESCRIPTION OF THE PREFERRED EMBODIMENT

Figure 1:
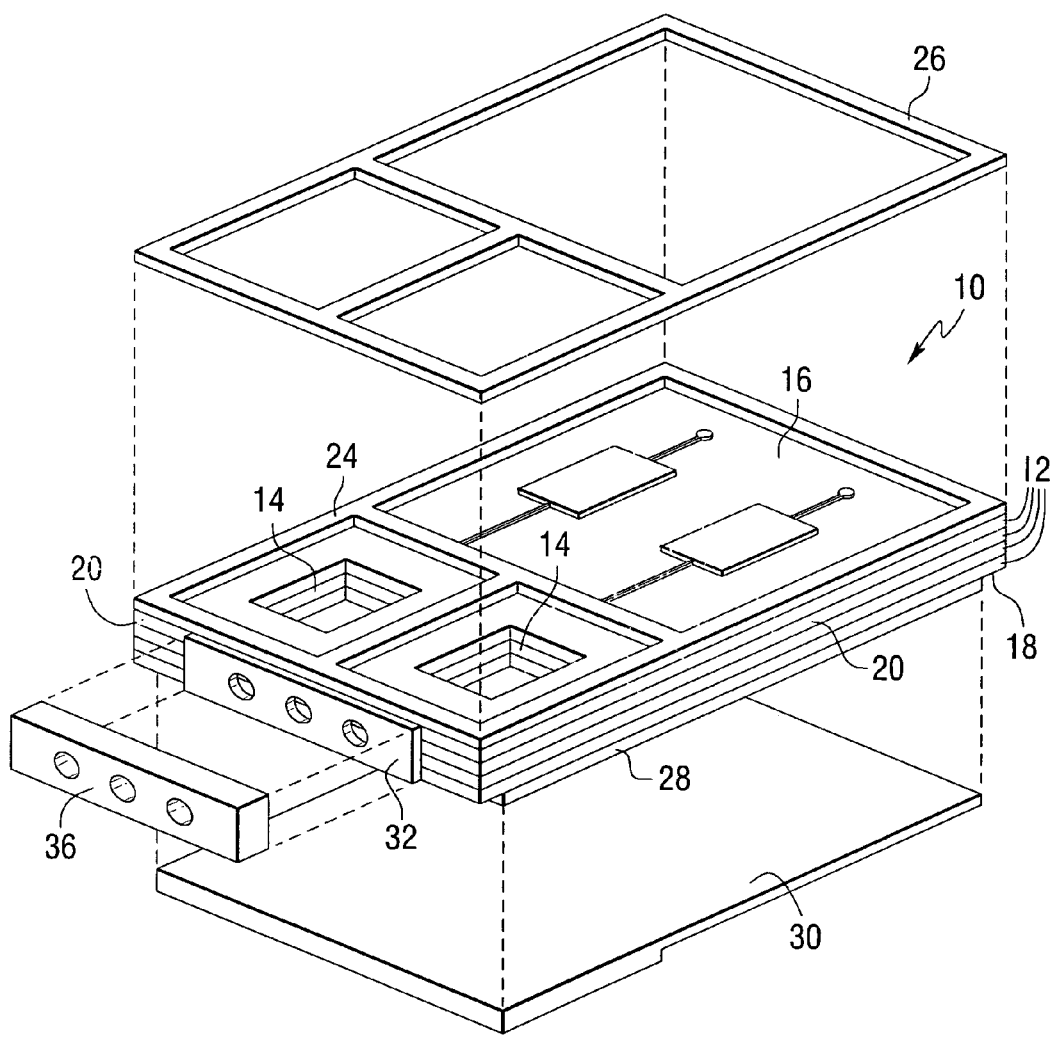
FIG. 1 is an exploded view illustrating a typical LTCC module.

Referring now to FIG. 1, there is illustrated an LTCC module 10 comprised of a plurality of ceramic layers 12 each having a pattern of metallization defining electrically conducting vias, conductors, and passive elements such as capacitors, inductors and resistors, by way of example. Although only several ceramic layers are shown for purposes of illustration, actual LTCC modules may be fabricated with dozens of such layers. The LTCC module 10 also includes wells 14 for receiving active elements such as micro chips. The structure has a top surface 16, a bottom surface 18 and a plurality of side surfaces 20, two of which may be seen.

The stack of ceramic layers 12 are cofired at a first, cofiring temperature of around 850° C. to complete densification and adhesion of metallization. It is often necessary to add certain components after the cofiring and these components are secured to a base of metal layers applied to one or more surfaces of the module. In accordance with the present invention, such bases are formed without degrading any buried or surface components and without significantly changing the electrical properties of the ceramic structure.

In FIG. 1 base 24 on a first, or top surface 16 is formed in multiple firings and has a predetermined pattern for receiving some component. Such component may be the frame member 26, which is brazed to base 24 and to which may be fastened a top lid for hermetically sealing the LTCC module 10.

Figure 1A:
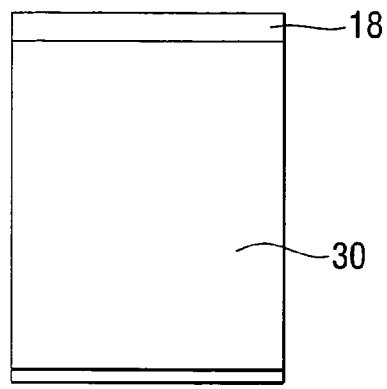
FIG. 1A is a view of the bottom of the LTCC module of FIG. 1.

In the present example, a second base 28 is applied to a second, or bottom surface 18 and accommodates a heat sink 30. A view of the bottom surface 18 and heat sink 30 is shown in more detail in FIG. 1A.

A third, or side surface 20 includes a base 32 that has an electrical connector block 36 connected to it.

Figure 2:
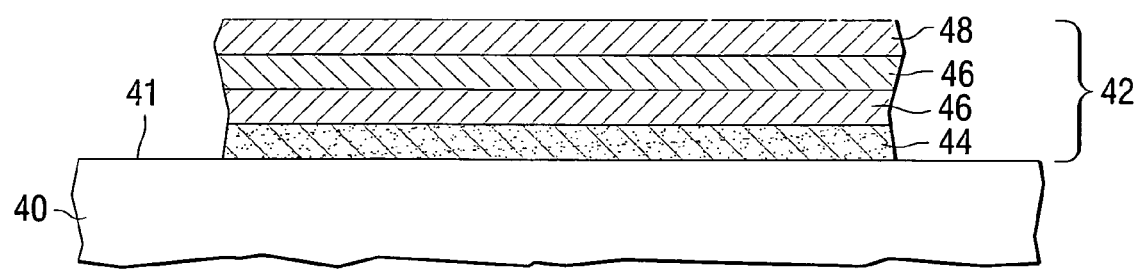
FIG. 2 is a more detailed view of a typical base applied to a surface of an LTCC module.

A typical multilayered base is illustrated in FIG. 2. Numeral 40 represents a ceramic surface of an LTCC module, the ceramic having a surface 41. Formed on the surface 41 is a multilayered base 42 for receiving some component such as illustrated in FIG. 1. The base 42 is comprised of a metal adhesion layer 44, one or more intermediate metal layers 46 (two are shown by way of example), and a top metal layer 48. The improved formation of a base such as base 42 is the subject of the present invention and to this end, reference is made to FIGS. 3A to 3D.

Figure 3A:
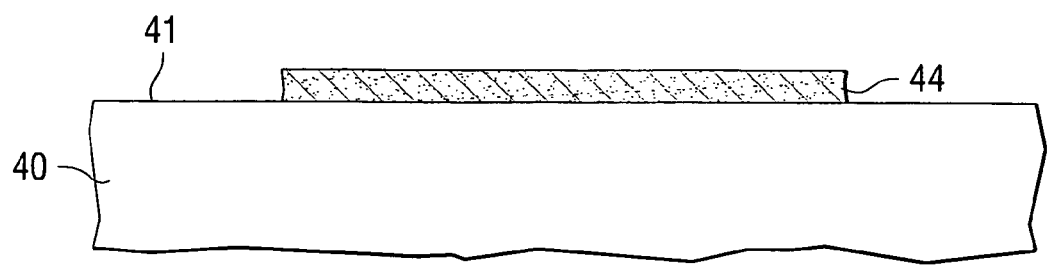
FIGS. 3A to 3D illustrate the improved process of the present invention.

In FIG. 3A the adhesion layer 44 is formed on the surface 41 of ceramic 40. The adhesion layer 44 is a metal such as gold, which generally includes one or more additives to promote adhesion to the ceramic. The adhesion layer 44 may be cofired at the first, cofiring temperature of ~850° C. along with the LTCC module, or may be fired after such cofiring, at a second, lower temperature of around 650° C., which is sufficient to partially sinter the metal but low enough so that the electrical and other properties of buried components and ceramic material will not be degraded.

Figure 3B:
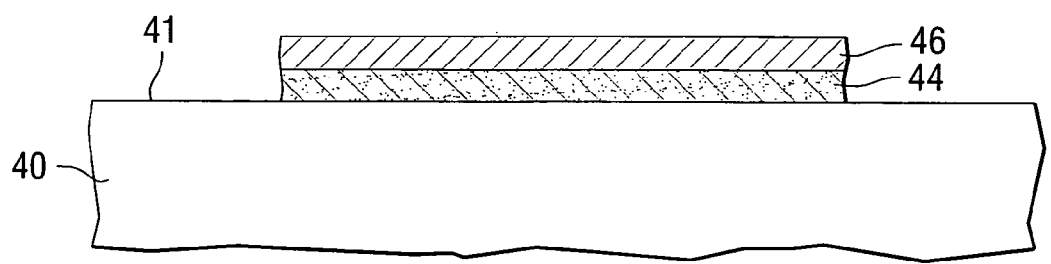
Figure 3C:
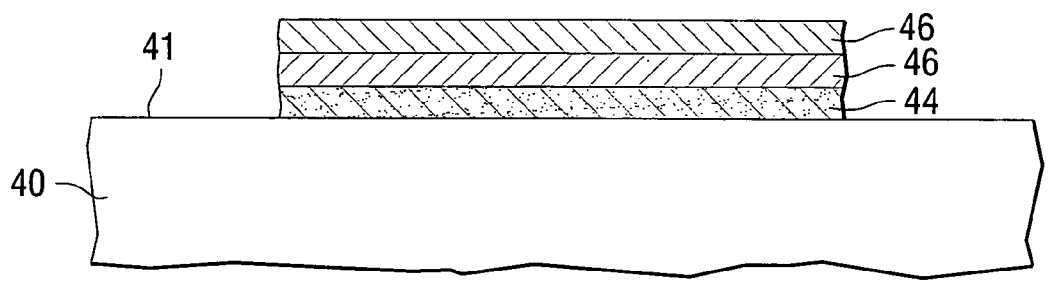

In FIG. 3B the first intermediate layer 46 is applied over the adhesion layer 44, in the same pattern, and the LTCC module is fired at the second, lower temperature of 650° C. The second intermediate layer 46 is applied over the first intermediate layer, as indicated in FIG. 3C, and the LTCC module is again fired at the second, lower firing. temperature of 650° C.

Figure 3D:
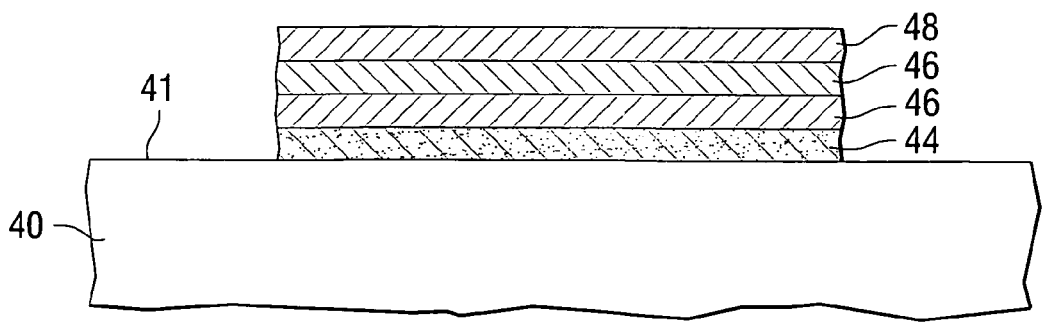

In FIG. 3D, a top layer 48 is applied over the last intermediate layer 46, after which the module is again fired. The particular firing temperature depends upon whether or not another base is to be formed on another surface. If no further bases are to be formed, the module is given a final firing at an elevated temperature to fully sinter all applied metal layers. This elevated temperature may vary depending on the specific ceramic material used, but will generally be in the range of around 800° C. to 850° C. (the cofiring temperature). If another base is to be formed, the module firing temperature is the second, lower temperature. For better adhesion of the particular component to be attached to the base 42, it is preferable that the top metallization layer 48 be of a pure metal without the previously mentioned additives. Further, the intermediate layers 46 may also be devoid of such additives.

In an alternate embodiment, a predetermined metal layer may be applied and a subsequent metal layer applied to it, prior to module firing. For example, one or more intermediate layer 46 may be printed over a previous layer and allowed to dry, with no module firing. Another layer is then printed over a previous layer and then the layers may be collectively fired at the second, reduced temperature, or at the elevated temperature, as the case may be.

The process of the present invention (post-fired metallization) is applicable to all LTCC materials that need additional metal after the stack of ceramic layers is fired. The process is a major deviation from the standard industry-wide process of multiple firings at the cofiring temperature of 850° C. The process of the present invention solves two major issues encountered using the standard process. The first is the integrity of buried components such as buried resistors is maintained, and the second is that any physical and dielectric changes are minimized or eliminated.

The foregoing detailed description merely illustrates the principles of the invention. It will thus be appreciated that those skilled in the art will be able to devise various arrangements which, although not explicitly described or shown herein, embody the principles of the invention and are thus within its spirit and scope.

What is claimed is:

1. A method of forming at least a first multilayered base having a first predetermined pattern on one surface of a multi-surfaced LTCC module comprised of a stack of ceramic layers fired at a first cofired temperature, comprising the steps of:

applying a first plurality of metal layers, including an adhesion layer, one or more intermediate layers and a top layer, in said first predetermined pattern to build up a desired thickness of said first multilayered base, and firing said module after application of predetermined ones of said plurality of metal layers at a second temperature lower than said first, cofired temperature, said second temperature having a value to partially sinter said plurality of metal layers of said first base; and which includes the steps of sequentially applying said metal layers to said one surface and allowing each of said metal layers to dry and then firing each of said layers at said second temperature before applying a subsequent metal layer; and a) if other bases in addition to said first base are to be formed; only firing said module at said second temperature to partially sinter said metal layers in said first base; but b) if no further bases are to be formed, again firing said module including said first base at an elevated temperature greater than said second temperature substantially equivalent to said first cofired temperature to fully sinter all said metal layers in said first base said first base receiving a first predetermined component on said one surface of said module.

2. A method according to claim 1 which includes the steps of:

firing of said module including said first base, at said second temperature; forming a second base on a second surface of said module, comprising the further step of:

applying a second plurality of metal layers, including an adhesion layer, one or more intermediate layers, and a top metal layer, in a second predetermined pattern to build up a desired thickness of said second base, and firing said module after application of predetermined ones of said plurality of metal layers at said second second temperature lower than said first cofired temperature, but of a value to partially sinter said plurality of metal layers of said second base; and which includes the step;

sequentially applying said metal layers to said second surface thereby forming said second base, allowing each of said metal layers to dry applying a subsequent metal layer; and if further bases are to be formed, only firing said module at said second temperature to partially sinter said metal layers in said first and second bases; but b) if no further bases are to be formed, again firing said module at said elevated temperature greater than said second temperature substantially equivalent to said first cofired temperature to frilly sinter all said metal layers of said first and second said bases said second base receiving a second predetermined component on said second surface of said module.

3. A method according to claim 2 which includes the steps of:

firing said module including said first and second base, at said second temperature, forming a third base on a third surface of said module, comprising the steps of:

applying a third plurality of metal layers, including an adhesion layer, one or more intermediate layers and a top metal layer, in a third predetermined pattern to build up a desired thickness of said third base, and firing said module after application of predetermined ones of said plurality of metal layers at said second temperature lower than said first cofired temperature, but of a value to partially sinter said plurality of metal layers of said third base; and which includes the steps of sequentially applying one said metal layers to said third surface thereby forming said third base, allowing each of said metal layers to dry and then firing each said layer at said second temperature before applying a subsequent metal layer; and if further bases are to be formed, only firing said module at said second temperature to partially sinter said metal layers in said first, second and third bases; but b) if no further bases are to be formed, again firing said module at said elevated temperature greater than said second temperature substantially equivalent to said first cofired temperature to fully sinter all said metal layers of said first, second and third bases said third base receiving a third predetermined component on said third surface of said module.

4. A method according to claim 3 which includes the step of:

applying an electrical connector member as said third component to said third base.

5. A method according to claim 2 which includes the step of:

applying a heat sink member as said second component to said second base.

6. A method according to claim 1 which includes the step of:

firing said module at a said second temperature of around 650° C.

7. A method according to claim 1, wherein said first cofired temperature is in the range from around 800° C. to around 850° C.

8. A method according to claim 1 which includes the step of:

applying a frame member as said first component to said first base.

9. A method of forming a plurality of multilayered bases each having a predetermined pattern on respective different surfaces of a multi-surfaced LTCC module comprised of a stack of ceramic layers fired at a first cofired temperature, comprising the steps of:

applying a plurality of metal layers, each including an adhesion layer, one or more intermediate layers and a top layer, in respective predetermined patterns to build up a desired thickness of said plurality of multilayered bases, and firing said module after application of predetermined ones of said plurality of metal layers of said plurality of bases at a second temperature lower than said first cofired temperature, said second temperature having a value to partially sinter said plurality of metal layers of said plurality of multilayered bases; and which further includes the steps of sequentially applying said metal layers of each of said plurality of bases to said respective different surfaces of said module and allowing each of said metal layers to dry and firing each said layer at said second temperature before applying a subsequent metal layer; and again firing said module including said plurality of bases at an elevated temperature greater than said second temperature to fully sinter all said metal layers in said plurality of bases;

applying a frame member as a first component to a first base of said plurality of bases;

applying a heat sink member as a second component to a second base of said plurality of bases; and, applying an electrical connector member as a third component to a third base of said plurality of bases.

10. A method according to claim 9, wherein said first cofired temperature is in a range from around 800° C. to around 850° C., said second temperature is around 650° C., and said elevated temperature is substantially equivalent to said first cofired temperature.

* * * * *